United States Patent
Yan

(10) Patent No.: US 10,200,039 B2
(45) Date of Patent: Feb. 5, 2019

(54) VOLTAGE LEVEL TRANSLATION CIRCUIT AND MULTIPLE INTERFACE IN COMMUNICATION SYSTEM

(71) Applicant: AMBIT MICROSYSTEMS (SHANGHAI) LTD., Shanghai (CN)

(72) Inventor: Yu-Hu Yan, New Taipei (TW)

(73) Assignee: AMBIT MICROSYSTEMS (SHANGHAI) LTD., Shanghai (CN)

( * ) Notice: Subject to any disclaimer, the term of this patent is extended or adjusted under 35 U.S.C. 154(b) by 66 days.

(21) Appl. No.: 15/252,618

(22) Filed: Aug. 31, 2016

(65) Prior Publication Data

US 2018/0026635 A1 Jan. 25, 2018

(30) Foreign Application Priority Data

Jul. 25, 2016 (TW) .................................. 105123406

(51) Int. Cl.
  *H03K 19/0175* (2006.01)
  *H03K 19/0185* (2006.01)
(52) U.S. Cl.
  CPC ........................ *H03K 19/017518* (2013.01)
(58) Field of Classification Search
  CPC ....... H03K 19/0175; H03K 19/017518; H03K 19/017545; H03K 19/0185; H03K 2217/0054

USPC .................. 327/333; 326/62, 63, 68, 80, 81; 365/189.11
  See application file for complete search history.

(56) References Cited

U.S. PATENT DOCUMENTS

2012/0256656 A1 10/2012 Stirk et al.
2013/0222036 A1* 8/2013 Kwon ............. H03K 3/356113
                                                        327/333

FOREIGN PATENT DOCUMENTS

CN          101730895 A       6/2010

* cited by examiner

*Primary Examiner* — Lincoln Donovan
*Assistant Examiner* — Colleen O Toole
(74) *Attorney, Agent, or Firm* — ScienBiziP, P.C.

(57) ABSTRACT

A voltage level translation circuit includes a first energy storage unit, a second energy storage unit, a first voltage level translation unit, and a second voltage level translation unit. The first voltage level translation unit is configured to translate a first communication interface transmitting pin voltage signal to realize a first communication between a first communication interface transmitting pin and a second communication interface receiving pin. The second voltage level translation unit is configured to translate a second communication interface transmitting pin voltage signal to realize a second communication between a second communication interface transmitting pin and a first communication interface receiving pin. A multiple interface communication system is also provided.

20 Claims, 3 Drawing Sheets

VOLTAGE LEVEL TRANSLATION CIRCUIT AND MULTIPLE INTERFACE IN COMMUNICATION SYSTEM

FIELD

The subject matter herein generally relates to a voltage level translation circuit and a multiple interface communication system.

BACKGROUND

In a communication system with two interfaces, a voltage level circuit or a voltage level chip is required between two interfaces having different reference voltages.

BRIEF DESCRIPTION OF THE DRAWINGS

Implementations of the present technology will now be described, by way of example only, with reference to the attached figures.

DETAILED DESCRIPTION

Figure 1:
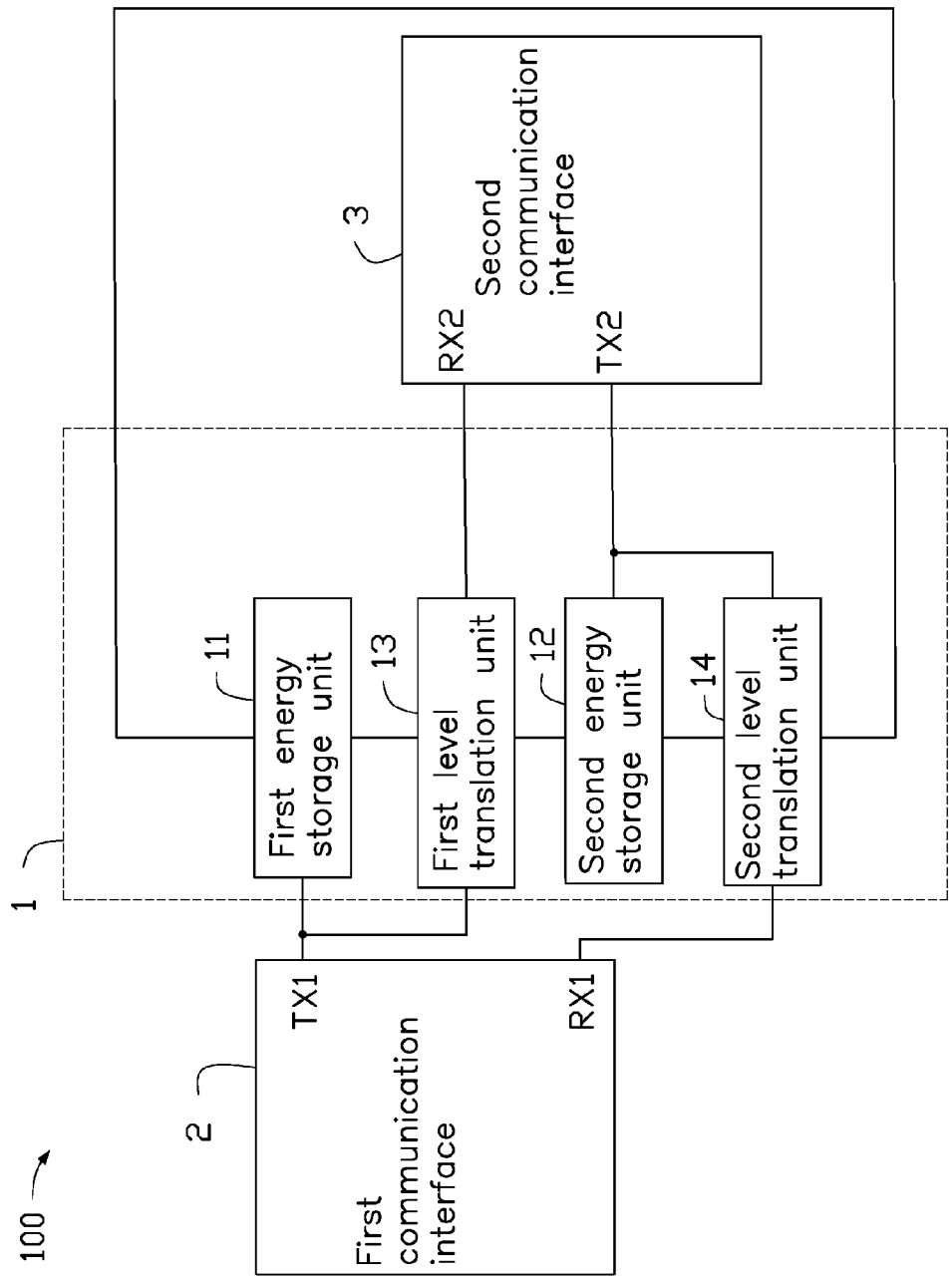
FIG. 1 is a block diagram of an embodiment of a multiple interface communication system of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure. It should be noted that references to "an" or "one" embodiment in this disclosure are not necessarily to the same embodiment, and such references mean "at least one".

Several definitions that apply throughout this disclosure will now be presented.

The term "coupled" is defined as connected, whether directly or indirectly through intervening components, and is not necessarily limited to physical connections. The connection can be such that the objects are permanently coupled or releasably coupled. The term "comprising," when utilized, means "including, but not necessarily limited to"; it specifically indicates open-ended inclusion or membership in the so-described combination, group, series and the like.

The disclosure is described in relation to a multiple interface communication system.

FIG. 1 illustrates an embodiment of a multiple interface communication system 100.

The multiple interface communication system 100 comprises a voltage level translation circuit 1, a first communication interface 2, and a second communication interface 3.

The voltage level translation circuit 1 is coupled between the first communication interface 2 and the second communication interface 3.

When a first communication interface voltage level is different from a second communication interface 3 voltage level, the first communication interface 2 communicates with the second communication interface 3 via the voltage level translation circuit 1.

In one embodiment, the first communication interface voltage level can be 5V and the second communication interface voltage level can be 3.3V. The first communication interface voltage level also can be 3.3V and the second communication interface voltage level can be 5V.

The first communication interface 2 comprises a first transmitting pin TX1 and a first receiving pin RX1. The second communication interface 3 comprises a second transmitting pin TX2 and a second receiving pin RX2. The first transmitting pin TX1 is configured to transmit a first transmitting pin voltage signal to the second receiving pin RX2 in response to the first communication interface 2 communicating with the second communication interface 3. The second transmitting pin TX2 is configured to transmit a second transmitting pin voltage signal to the first receiving pin RX1 in response to the first communication interface 2 communicating with the second communication interface 3.

The voltage level translation circuit 1 comprises a first energy storage unit 11, a second energy storage unit 12, a first voltage level translation unit 13, and a second voltage level translation unit 14. The first energy storage unit 11 is coupled to the first transmitting pin TX1. The first energy storage unit 11 is configured to store energy according to the first transmitting pin voltage signal. The second energy storage unit 12 is coupled to the second transmitting pin TX2. The second energy storage unit 12 is configured to store energy according to the second transmitting pin voltage signal.

The first voltage level translation unit 13 is coupled to the first transmitting pin TX1, the second receiving pin RX2, the first energy storage unit 11, and the second energy storage unit 12. The first voltage level translation unit 13 is configured to translate the first transmitting pin voltage signal to realize a first communication between the first transmitting pin TX1 and the second receiving pin RX2. The second voltage level translation unit 14 is coupled to the second transmitting pin TX2, the first receiving pin RX1, the first energy storage unit 11, and the second energy storage unit 12. The second voltage level translation unit 14 is configured to translate the second transmitting pin voltage signal to realize a second communication between the second transmitting pin TX2 and the first receiving pin RX1.

In one embodiment, the first communication interface 2 communicates with the second communication interface 3 via the first transmitting pin voltage signal and the second transmitting pin voltage signal.

Figure 2:
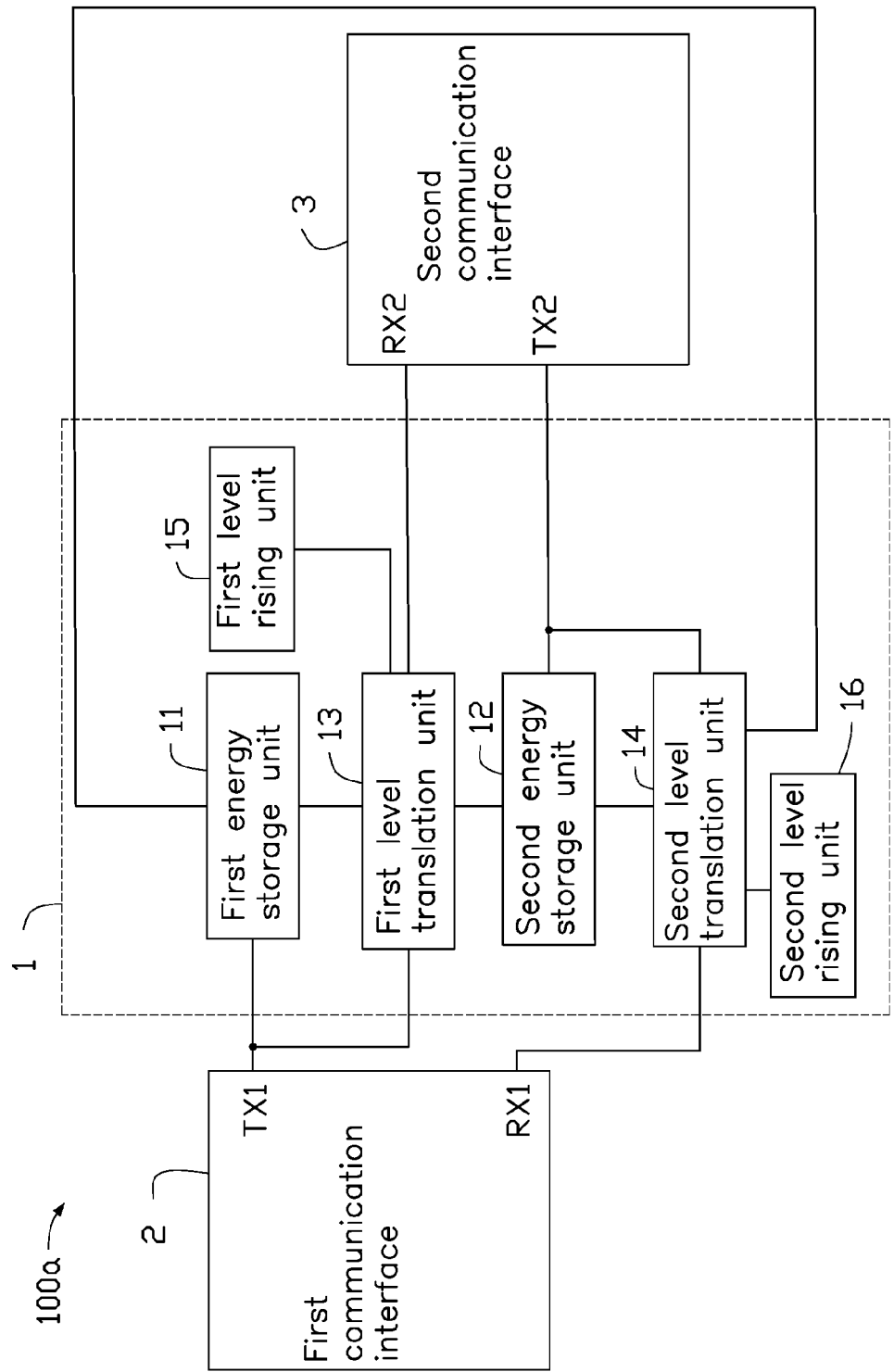
FIG. 2 is a block diagram of an embodiment of a multiple interface communication system of the present disclosure.

FIG. 2 illustrates an embodiment of an multiple interface communication system 100a.

The voltage level translation circuit 1 further comprises a first voltage level raising unit 15 and a second voltage level raising unit 16. The first voltage level raising unit 15 is coupled to the first voltage level translation unit 13. The first voltage level raising unit 15 is configured to raise the first transmitting pin signal voltage signal to shorten a second receiving pin voltage signal rise time. Thereby, a waveform of the first transmitting pin TX1 voltage signal and a waveform of the second receiving pin RX2 voltage signal are synchronous. The second voltage level raising unit 16 is coupled to the second voltage level translation unit 14. The second voltage level raising unit 16 is configured to raise the second transmitting pin voltage signal to shorten a first receiving pin voltage signal rise time. Thereby, a waveform of the second transmitting pin voltage signal and a waveform of the first receiving pin voltage signal are synchronous.

Figure 3:
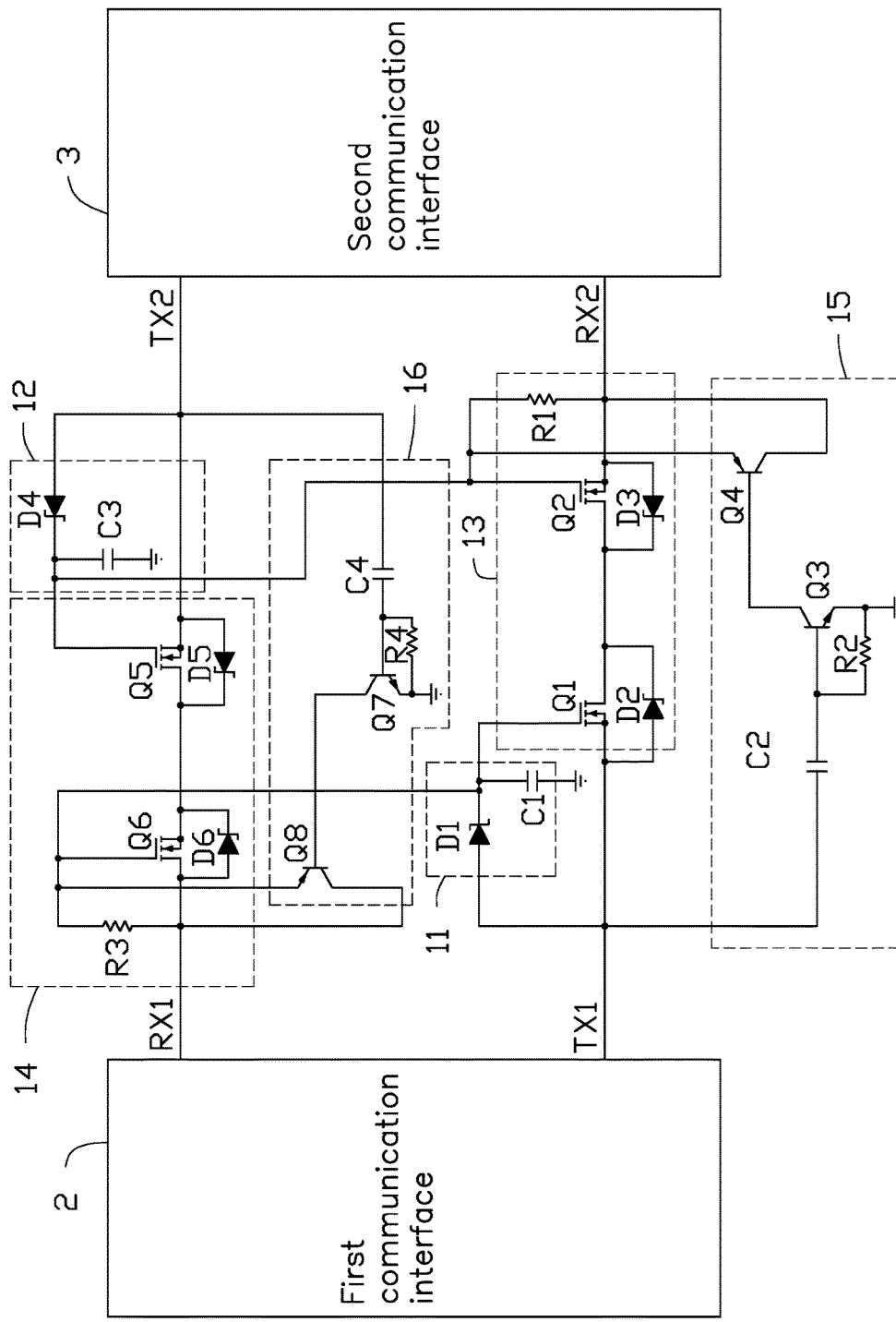
FIG. 3 is a circuit diagram of an embodiment of the multiple interface communication system of FIG. 2 of the present disclosure.

Referring to FIG. 3, the first energy storage unit 11 comprises a first diode D1 and a first capacitor C1. A first diode anode is coupled to the first transmitting pin TX1, a first diode cathode is coupled to a first capacitor first terminal, and a first capacitor second terminal is grounded.

The first voltage level translation unit 13 comprises a first metal oxide semiconductor field effect transistor (MOSFET) Q1, a second MOSFET Q2, a second diode D2, a third diode D3, and a first resistor R1. A first MOSFET gate electrode is coupled to the first diode cathode and a first MOSFET source electrode is coupled to the first transmitting pin TX1. A second diode anode is coupled to the first MOSFET source electrode and a second diode cathode is coupled to a first MOSFET drain electrode. A second MOSFET drain electrode is coupled to the first MOSFET drain electrode and a second MOSFET source electrode is coupled to the second receiving pin RX2. The first resistor R1 is coupled between a second MOSFET gate electrode and the second MOSFET source electrode. A third diode anode is coupled to the second MOSFET source electrode and a third diode cathode is coupled to the second MOSFET drain electrode.

The first voltage level raising unit 15 comprises a second capacitor C2, a second resistor R2, a first transistor Q3 and a second transistor Q4. A second capacitor first terminal is coupled to the first transmitting pin TX1, a second capacitor second terminal is coupled to a second resistor first terminal, and a second resistor second terminal is grounded. A first transistor control terminal is coupled to a node between the second capacitor C2 and the second resistor R2 and a first transistor first terminal is coupled to a second transistor control terminal. A first transistor second terminal is grounded. A second transistor first terminal is coupled to the second receiving pin RX2 and a second transistor second terminal is coupled to the second MOSFET gate electrode.

The second energy storage unit 12 comprises a fourth diode D4 and a third capacitor C3. A fourth diode anode is coupled to the second transmitting pin TX2, a fourth diode cathode is coupled to a third capacitor first terminal, and a third capacitor second terminal is grounded.

The second voltage level translation unit 14 comprises a third MOSFET Q5, a fourth MOSFET Q6, a fifth diode D5, a sixth diode D6, and a third resistor R3. A third MOSFET gate electrode is coupled to the fourth diode cathode and the second MOSFET gate electrode, and a third MOSFET source electrode is coupled to the second transmitting pin TX2. A fifth diode anode is coupled to the third MOSFET source electrode and a fifth diode cathode is coupled to a third MOSFET drain electrode. A fourth MOSFET drain electrode is coupled to the third MOSFET drain electrode, a fourth MOSFET source electrode is coupled to the first receiving pin RX1, and a fourth MOSFET gate electrode is coupled to the first MOSFET gate electrode. The third resistor R3 is coupled between the fourth MOSFET gate electrode and the fourth MOSFET source electrode. A sixth diode anode is coupled to the fourth MOSFET source electrode and a sixth diode cathode is coupled to the fourth MOSFET drain electrode.

The second voltage level raising unit 16 comprises a fourth capacitor C4, a fourth resistor R4, a third transistor Q7, and a fourth transistor Q8. A fourth capacitor first terminal is coupled to the second transmitting pin TX2, a fourth capacitor second terminal is coupled to a fourth resistor first terminal, and a fourth resistor second terminal is grounded. A third transistor control terminal is coupled to a node between the fourth capacitor C4 and the fourth resistor R4 and a third transistor first terminal is coupled to a fourth transistor control terminal. A third transistor second terminal is grounded. A fourth transistor first terminal is coupled to the first receiving pin RX1 and a fourth transistor second terminal is coupled to the fourth MOSFET gate electrode.

The first energy storage unit 11 charges the first capacitor C1 according to the first transmitting pin TX1 voltage signal and supplies a reference voltage to the first MOSFET gate electrode, the fourth MOSFET gate electrode, the fourth transistor second terminal, and the third resistor first terminal. Thereby, the first MOSFET Q1, the fourth MOSFET Q6, and the fourth transistor Q8 are turned on. The second energy storage unit 12 charges the third capacitor C3 according to the second transmitting pin TX2 voltage signal and supplies a reference voltage to the second MOSFET gate electrode, the third MOSFET gate electrode, the second transistor second terminal, and the first resistor first terminal. Thereby, the second MOSFET Q2, the third MOSFET Q5, and the second transistor Q4 are turned on.

In one embodiment, each of the first MOSFET Q1, the second MOSFET Q2, the third MOSFET Q5, and the fourth MOSFET Q6 can be N type MOSFETs. A N type MOSFET switch frequency is necessary to match a communication speed between the first communication interface 2 and the second communication interface 3.

In one embodiment, the first to sixth diodes, D1 to D6, can be Schottky diodes. The first transistor Q3 and the third transistor Q7 can be NPN transistors. The first transistor control terminal and the third transistor control terminal are NPN transistor bases, the first transistor first terminal and the third transistor first terminal are NPN transistor collectors, and the first transistor second terminal and the third transistor second terminal are NPN transistor emitters. The second transistor Q4 and the fourth transistor Q8 can be PNP transistors. The second transistor control terminal and the fourth transistor control terminal are PNP transistor bases, the second transistor first terminal and the fourth transistor first terminal are PNP transistor collectors, and the second transistor second terminal and the fourth transistor second terminal are PNP transistor emitters.

The voltage level of the first communication interface voltage signal is a first reference value, and the voltage level of the second communication interface voltage signal is a second reference value. The first communication interface 2 can communicate with the second communication interface 3 via the first MOSFET Q1, the second MOSFET Q2, the third MOSFET Q5, and the fourth MOSFET Q6. The first reference value and the second reference value have not different between maximum value or minimum value.

While the disclosure has been described by way of example and in terms of the embodiment, it is to be understood that the disclosure is not limited thereto. On the contrary, it is intended to cover various modifications and similar arrangements as would be apparent to those skilled in the art. Therefore, the range of the appended claims should be accorded the broadest interpretation so as to encompass all such modifications and similar arrangements.

What is claimed is:

1. A voltage level translation circuit comprising:
 a first energy storage unit, coupled to a first communication interface transmitting pin, configured to store energy according to a first communication interface transmitting pin voltage signal;

a second energy storage unit, coupled to a second communication interface transmitting pin, configured to store energy according to a second communication interface transmitting pin voltage signal;

a first voltage level translation unit, coupled to the first communication interface transmitting pin, a second communication interface receiving pin, the first energy storage unit, and the second energy storage unit; the first voltage level translation unit configured to translate the first communication interface transmitting pin voltage signal to realize a first communication between the first communication interface transmitting pin and the second communication interface receiving pin; and a second voltage level translation unit, coupled to the second communication interface transmitting pin, a first communication interface receiving pin, the first energy storage unit, and the second energy storage unit; the second voltage level translation unit configured to translate the second communication interface transmitting pin voltage signal to realize a second communication between the second communication interface transmitting pin and the first communication interface receiving pin;

wherein the first voltage level translation unit comprises:

a first metal oxide semiconductor field effect transistor (MOSFET), a first MOSFET gate electrode coupled to the first energy storage unit, and a first MOSFET source electrode coupled to the first communication interface transmitting pin;

a third diode, a third diode anode coupled to the first MOSFET source electrode, and a third diode cathode coupled to a first MOSFET drain electrode;

a second MOSFET, a second MOSFET gate electrode coupled to the second energy storage unit, a second MOSFET source electrode coupled to the second communication interface receiving pin, and a second MOSFET drain electrode coupled to the first MOSFET drain electrode; and a fourth diode, a fourth diode anode coupled to the second MOSFET source electrode, and a fourth diode cathode coupled to the second MOSFET drain electrode.

2. The voltage level translation circuit of claim 1, wherein the first energy storage unit comprises a first diode and a first capacitor, and the second energy storage unit comprises a second diode and a second capacitor; and a first diode anode is coupled to the first communication interface transmitting pin, a first diode cathode is coupled to a first capacitor first terminal, a first capacitor second terminal is grounded, a second diode anode is coupled to the second communication interface transmitting pin, a second diode cathode is coupled to a second capacitor first terminal, and a second capacitor second terminal is grounded.

3. The voltage level translation circuit of claim 1, wherein the second voltage level translation unit comprises:

a third MOSFET, a third MOSFET gate electrode coupled to the second energy storage unit, and a third MOSFET source electrode coupled to the second communication interface transmitting pin;

a fifth diode, a fifth diode anode coupled to the third MOSFET source electrode, and a fifth diode cathode coupled to a third MOSFET drain electrode;

a fourth MOSFET, a fourth MOSFET gate electrode coupled to the first energy storage unit, a fourth MOSFET source electrode coupled to the first communication interface receiving pin, and a fourth MOSFET drain electrode coupled to the third MOSFET drain electrode; and a sixth diode, a sixth diode anode coupled to the fourth MOSFET source electrode, and a sixth diode cathode coupled to the fourth MOSFET drain electrode.

4. The voltage level translation circuit of claim 3, wherein the first voltage level translation unit further comprises a first resistor; and the first resistor is coupled between the second MOSFET source electrode and the second MOSFET gate electrode; the second voltage level translation unit further comprises a second resistor; and the second resistor is coupled between the fourth MOSFET source electrode and the fourth MOSFET gate electrode.

5. The voltage level translation circuit of claim 1, further comprising a first voltage level raising unit, the first voltage level raising unit coupled to the first voltage level translation unit and configured to raise the first communication interface transmitting pin voltage signal to shorten a second communication interface receiving pin voltage signal rise time.

6. The voltage level translation circuit of claim 5, wherein the first voltage level raising unit comprises:

a third capacitor, and a third capacitor first terminal coupled to the first communication interface transmitting pin;

a third resistor, a third resistor first terminal coupled to a third capacitor second terminal, and a third resistor second terminal grounded;

a first transistor, a first transistor control terminal coupled to the third capacitor second terminal, and a first transistor second terminal grounded; and a second transistor, a second transistor control terminal coupled to a first transistor first terminal, a second transistor first terminal coupled to the second communication interface receiving pin, and a second transistor second terminal coupled to the first voltage level translation unit.

7. The voltage level translation circuit of claim 6, further comprising a second voltage level raising unit, the second voltage level raising unit coupled to the second voltage level translation unit and configured to raise the second communication interface transmitting pin voltage signal to shorten a first communication interface receiving pin voltage signal rise time.

8. The voltage level translation circuit of claim 7, wherein the second voltage level raising unit comprises:

a fourth capacitor, and a fourth capacitor first terminal coupled to the second communication interface transmitting pin;

a fourth resistor, a fourth resistor first terminal coupled to a fourth capacitor second terminal, and a fourth resistor second terminal grounded;

a third transistor, a third transistor control terminal coupled to the fourth capacitor second terminal, and a third transistor second terminal grounded; and a fourth transistor, a fourth transistor control terminal coupled to a third transistor first terminal, a fourth transistor first terminal coupled to the first communication interface receiving pin, and a fourth transistor second terminal coupled to the second voltage level translation unit.

9. The voltage level translation circuit of claim 8, wherein the first transistor control terminal and the third transistor control terminal are NPN transistor bases, the first transistor first terminal and the third transistor first terminal are NPN transistor collectors, the first transistor second terminal and the third transistor second terminal are NPN transistor emitters; and the second transistor control terminal and the fourth transistor control terminal are PNP transistor bases, the second transistor first terminal and the fourth transistor first terminal are PNP transistor collectors, and the second transistor second terminal and the fourth transistor second terminal are PNP transistor emitters.

10. A multiple interface communication system, comprising:
a first communication interface;
a second communication interface; and
a voltage level translation circuit comprising:
a first energy storage unit, coupled to a first communication interface transmitting pin, configured to store energy according to a first communication interface transmitting pin voltage signal;
a second energy storage unit, coupled to a second communication interface transmitting pin, configured to store energy according to a second communication interface transmitting pin voltage signal;
a first voltage level translation unit, coupled to the first communication interface transmitting pin, a second communication interface receiving pin, the first energy storage unit, and the second energy storage unit; the first voltage level translation unit configured to translate the first communication interface transmitting pin voltage signal to realize a first communication between the first communication interface transmitting pin and the second communication interface receiving pin; and
a second voltage level translation unit, coupled to the second communication interface transmitting pin, a first communication interface receiving pin, the first energy storage unit, and the second energy storage unit; the second voltage level translation unit configured to translate the second communication interface transmitting pin voltage signal to realize a second communication between the second communication interface transmitting pin and the first communication interface receiving pin;
wherein the first voltage level translation unit comprises:
a first metal oxide semiconductor field effect transistor (MOSFET), a first MOSFET gate electrode coupled to the first energy storage unit, and a first MOSFET source electrode coupled to the first communication interface transmitting pin;
a third diode, a third diode anode coupled to the first MOSFET source electrode, and a third diode cathode coupled to a first MOSFET drain electrode;
a second MOSFET, a second MOSFET gate electrode coupled to the second energy storage unit, a second MOSFET source electrode coupled to the second communication interface receiving pin, and a second MOSFET drain electrode coupled to the first MOSFET drain electrode; and
a fourth diode, a fourth diode anode coupled to the second MOSFET source electrode, and a fourth diode cathode coupled to the second MOSFET drain electrode.

11. The multiple interface communication system of claim 10, wherein the first energy storage unit comprises a first diode and a first capacitor, and the second energy storage unit comprises a second diode and a second capacitor; and a first diode anode is coupled to the first communication interface transmitting pin, a first diode cathode is coupled to a first capacitor first terminal, a first capacitor second terminal is grounded, a second diode anode is coupled to the second communication interface transmitting pin, a second diode cathode is coupled to a second capacitor first terminal, and a second capacitor second terminal is grounded.

12. The multiple interface communication system of claim 10,
wherein the second voltage level translation unit comprises:
a third MOSFET, a third MOSFET gate electrode coupled to the second energy storage unit, and a third MOSFET source electrode coupled to the second communication interface transmitting pin;
a fifth diode, a fifth diode anode coupled to the third MOSFET source electrode, and a fifth diode cathode coupled to a third MOSFET drain electrode;
a fourth MOSFET, a fourth MOSFET gate electrode coupled to the first energy storage unit, a fourth MOSFET source electrode coupled to the first communication interface receiving pin, and a fourth MOSFET drain electrode coupled to the third MOSFET drain electrode; and
a sixth diode, a sixth diode anode coupled to the fourth MOSFET source electrode, and a sixth diode cathode coupled to the fourth MOSFET drain electrode.

13. The multiple interface communication system of claim 12, wherein the first voltage level translation unit further comprises a first resistor; and the first resistor is coupled between the second MOSFET source electrode and the second MOSFET gate electrode; the second voltage level translation unit further comprises a second resistor; and the second resistor is coupled between the fourth MOSFET source electrode and the fourth MOSFET gate electrode.

14. The multiple interface communication system of claim 10, wherein the voltage level translation circuit further comprises a first voltage level raising unit, the first voltage level raising unit is coupled to the first voltage level translation unit and configured to raise the first communication interface transmitting pin voltage signal to shorten a second communication interface receiving pin voltage signal rise time.

15. The multiple interface communication system of claim 14, wherein the first voltage level raising unit comprises:
a third capacitor, and a third capacitor first terminal coupled to the first communication interface transmitting pin;
a third resistor, a third resistor first terminal coupled to a third capacitor second terminal, and a third resistor second terminal grounded;
a first transistor, a first transistor control terminal coupled to the third capacitor second terminal, and a first transistor second terminal grounded; and
a second transistor, a second transistor control terminal coupled to a first transistor first terminal, a second transistor first terminal coupled to the second communication interface receiving pin, and a second transistor second terminal coupled to the first voltage level translation unit.

16. The multiple interface communication system of claim 15, wherein the voltage level translation circuit further comprises a second voltage level raising unit, the second voltage level raising unit is coupled to the second voltage level translation unit and configured to raise the second communication interface transmitting pin voltage signal to shorten a first communication interface receiving pin voltage signal rise time.

17. The multiple interface communication system of claim 16, wherein the second voltage level raising unit comprises:
   a fourth capacitor, and a fourth capacitor first terminal coupled to the second communication interface transmitting pin;
   a fourth resistor, a fourth resistor first terminal coupled to a fourth capacitor second terminal, and a fourth resistor second terminal grounded;
   a third transistor, a third transistor control terminal coupled to the fourth capacitor second terminal, and a third transistor second terminal grounded; and
   a fourth transistor, a fourth transistor control terminal coupled to a third transistor first terminal, a fourth transistor first terminal coupled to the first communication interface receiving pin, and a fourth transistor second terminal coupled to the second voltage level translation unit.

18. The multiple interface communication system of claim 17, wherein the first transistor control terminal and the third transistor control terminal are NPN transistor bases, the first transistor first terminal and the third transistor first terminal are NPN transistor collectors, the first transistor second terminal and the third transistor second terminal are NPN transistor emitters; and the second transistor control terminal and the fourth transistor control terminal are PNP transistor bases, the second transistor first terminal and the fourth transistor first terminal are PNP transistor collectors, and the second transistor second terminal and the fourth transistor second terminal are PNP transistor emitters.

19. A voltage level translation circuit comprising:
   a first energy storage unit, coupled to a first communication interface transmitting pin, configured to store energy according to a first communication interface transmitting pin voltage signal;
   a second energy storage unit, coupled to a second communication interface transmitting pin, configured to store energy according to a second communication interface transmitting pin voltage signal;
   a first voltage level translation unit, coupled to the first communication interface transmitting pin, a second communication interface receiving pin, the first energy storage unit, and the second energy storage unit; the first voltage level translation unit configured to translate the first communication interface transmitting pin voltage signal to realize a first communication between the first communication interface transmitting pin and the second communication interface receiving pin; and
   a second voltage level translation unit, coupled to the second communication interface transmitting pin, a first communication interface receiving pin, the first energy storage unit, and the second energy storage unit; the second voltage level translation unit configured to translate the second communication interface transmitting pin voltage signal to realize a second communication between the second communication interface transmitting pin and the first communication interface receiving pin;
   wherein the first energy storage unit comprises a first diode and a first capacitor, and the second energy storage unit comprises a second diode and a second capacitor; and a first diode anode is coupled to the first communication interface transmitting pin, a first diode cathode is coupled to a first capacitor first terminal, a first capacitor second terminal is grounded, a second diode anode is coupled to the second communication interface transmitting pin, a second diode cathode is coupled to a second capacitor first terminal, and a second capacitor second terminal is grounded.

20. A multiple interface communication system, comprising:
   a first communication interface;
   a second communication interface; and
   a voltage level translation circuit comprising:
   a first energy storage unit, coupled to a first communication interface transmitting pin, configured to store energy according to a first communication interface transmitting pin voltage signal;
   a second energy storage unit, coupled to a second communication interface transmitting pin, configured to store energy according to a second communication interface transmitting pin voltage signal;
   a first voltage level translation unit, coupled to the first communication interface transmitting pin, a second communication interface receiving pin, the first energy storage unit, and the second energy storage unit; the first voltage level translation unit configured to translate the first communication interface transmitting pin voltage signal to realize a first communication between the first communication interface transmitting pin and the second communication interface receiving pin; and
   a second voltage level translation unit, coupled to the second communication interface transmitting pin, a first communication interface receiving pin, the first energy storage unit, and the second energy storage unit; the second voltage level translation unit configured to translate the second communication interface transmitting pin voltage signal to realize a second communication between the second communication interface transmitting pin and the first communication interface receiving pin;
   wherein the first energy storage unit comprises a first diode and a first capacitor, and the second energy storage unit comprises a second diode and a second capacitor; and a first diode anode is coupled to the first communication interface transmitting pin, a first diode cathode is coupled to a first capacitor first terminal, a first capacitor second terminal is grounded, a second diode anode is coupled to the second communication interface transmitting pin, a second diode cathode is coupled to a second capacitor first terminal, and a second capacitor second terminal is grounded.

* * * * *